United States Patent
Ono et al.

(10) Patent No.: US 6,603,562 B1
(45) Date of Patent: Aug. 5, 2003

(54) TWO-DIMENSIONAL POSITIONING APPARATUS AND METHOD FOR MEASURING LASER LIGHT FROM THE APPARATUS

(75) Inventors: Yutaka Ono, Tokyo (JP); Shigeru Hashida, Tokyo (JP); Yutaka Koizumi, Tokyo (JP); Fumio Kaiho, Tokyo (JP); Yasuhito Kosugi, Tokyo (JP); Ryuichi Jimbo, Tokyo (JP); Atsufumi Kimura, Tokyo (JP)

(73) Assignee: Yokogawa Electric Corporation, Tokyo (JP)

( * ) Notice: Subject to any disclaimer, the term of this patent is extended or adjusted under 35 U.S.C. 154(b) by 159 days.

(21) Appl. No.: 09/692,960

(22) Filed: Oct. 21, 2000

(30) Foreign Application Priority Data

| Oct. 29, 1999 | (JP) | ............ 11/308797 |
| Nov. 22, 1999 | (JP) | ............ 11/331480 |
| Nov. 25, 1999 | (JP) | ............ 11/334653 |
| Nov. 29, 1999 | (JP) | ............ 11/338383 |

(51) Int. Cl.$^7$ ............................................. G01B 11/02
(52) U.S. Cl. ................................. 356/500; 356/399
(58) Field of Search .................... 356/500, 508, 356/399, 400, 498, 493, 486; 355/53; 33/1 M

(56) References Cited

U.S. PATENT DOCUMENTS

| 3,715,599 A | * | 2/1973 | Marcy ................... 250/201.1 |
| 5,506,684 A | * | 4/1996 | Ota et al. ................... 356/401 |
| 5,633,720 A | * | 5/1997 | Takahashi ................... 356/401 |
| 5,638,179 A | * | 6/1997 | Masuyuki ................... 356/603 |
| 5,708,505 A | * | 1/1998 | Sogard et al. ................ 356/500 |
| 6,331,885 B1 | * | 12/2001 | Nishi ........................... 355/53 |
| 6,414,742 B1 | * | 7/2002 | Korenaga et al. ............ 355/53 |

FOREIGN PATENT DOCUMENTS

| JP | 63-242187 | * 10/1988 | ............ H02P/5/00 |
| JP | 04-166718 | * 6/1992 | ............ G01D/5/36 |
| JP | WO 99/16113 | * 4/1999 | ............ H01L/21/27 |

* cited by examiner

Primary Examiner—Robert H. Kim
Assistant Examiner—Chih-Cheng Glen Kao
(74) Attorney, Agent, or Firm—Moonray Kojima

(57) ABSTRACT

A two-dimensional positioning apparatus for positioning an object in a two dimensional direction, wherein are provided a platen, a slider having two X-axis motors and sensors and a Y-axis motor and sensor disposed above the platen, a converter for providing signals to detect the X-axis position of the center point of the slider, a controller for feedback control of the slider in a X-axis direction and a yaw direction, and for feedback control in the Y-direction, and a converter circuit for converting output of the controller to propulsion commands to be supplied to the motors, wherein a limiter is provided to restrict one axis limits of the propulsion commands. In this manner, accuracy is improved and flexibility is increased.

8 Claims, 13 Drawing Sheets

TWO-DIMENSIONAL POSITIONING APPARATUS AND METHOD FOR MEASURING LASER LIGHT FROM THE APPARATUS

BACKGROUND OF THE INVENTION

1. Field of Invention

This invention relates to two-dimensional positioning apparatus, and more particularly, to such apparatus wherein components thereof and methods used therein are improved.

2. Description of the Prior Art

A two-dimensional positioning apparatus is disclosed, for example, in Japan unexamined patent application No. 2000-65970, and shown in FIG. 1, wherein a platen 10, which is made of a magnetic material, is provided with teeth formed at fixed spacings in the X-axis and Y-axis directions. Only part of the teeth are shown for simplicity of description. An object to be positioned is placed on slider 11. Levitating means 12 causes slider 11 to be disposed or levitated above platen 10. Nozzles are provided on the surface of slider 11 facing platen 10 Jets of compressed air are directed through the nozzles by levitating means 12 to produce a levitating force.

A Y-axis motor 13 is mounted on slider 11 and teeth 132 are formed on Y-axis motor 13 at fixed spacings in the Y-axis direction. Y-axis motor produces magnetic attractive force between teeth 132 and teeth 101 of platen 10 to cause slider 11 to move in the Y-axis direction.

X-axis motors 14 and 15 are mounted on slider 11 to be symmetrically opposite to each other in relation to the center point of slider 11. Teeth 141 and 151 are formed on X-axis motors 14 and 15 at fixed spacings in the X-axis direction. X-axis motors 14 and 15 provide magnetic attractive force between teeth 141 and 101 and between teeth 151 and 101 to cause slider 11 to move in the X-axis direction. Connecting members 111 and 112 connect X-axis motor 13 to both X-axis motors 14 and 15.

An X-axis mirror 16 is attached to one side of platen 10, and a mirror surface is formed in the Y-axis direction. A Y-axis mirror 17 is attached to another side adjacent to the side of platen 10, and a mirror surface is formed in the X-axis direction.

A Y-axis position sensor 18, which is mounted on Y-axis motor 13, is a laser interferometer that emits light beams to imping Y-axis mirror 17, receives catoptric light beams from Y-axis mirror 17, and detects Y-axis position of slider 11 by means of optical interference.

X-axis position sensors 19 and 20, which are mounted on the X-axis motors 14 and 15, respectively, are laser interferometers that emit light beams to X-axis mirror 16, receive catoptric light beams from X-axis mirror 16, and detect X-axis position of slider 11 by means of optical interference.

A Y-axis controller 21 feedback controls the position of slider 11 according to the deviation of a Y-axis directive position from a position detected by Y-axis position sensor 18.

X-axis controllers 22 and 23 feedback control the position of slider 11 according to deviations of X-axis directive positions from positions detected by X-axis position sensors 19 and 20.

A rotational error may occur around an axis perpendicular to the X and Y axes of slider 11. This phenomenon is referred to as yawing and the angle of rotational error, i.e. the yaw angle, is assumed to be θ.

In the apparatus shown in FIG. 1, the X-axis and θ-axis positions are controlled by supplying the same position command to X-axis controllers 22 and 23. The state in which any yawing in slider 11 is eliminated is defined as θ=0.

For light beams emitted by Y-axis position sensor 18 and X-axis position sensors 19 and 20 toward mirrors to be able to correctly return to their respective sensors, the yaw angle must be maintained at nearly zero, i.e. θ=0. If the yaw angle θ deflects the light in a large measure, the light beams emitted by Y-axis position sensor 18 and X-axis positions sensors 19 and 20 will fail to return to the sensors. Thus, the position of slider 11 will be unknown, and hence, the position and speed of slider 11 cannot be feedback controlled. Since the position sensors are optical sensors using laser interferometers, even a small rotational error of slider 11 can result in lack of control.

In the FIG. 1 apparatus, it is difficult to adjust angle θ to be close to 0 for the following reasons: First, it is not possible to separately set the control characteristics of the θ-axis and X-axis directions. To be able to effect control and satisfy the angle θ=0, the servomechanical rigidity of angle θ may be increased. However, the servomechanical ridigity in the θ-axis direction is uniquely fixed when the control methods and bandwidths of the X-axis controllers 22 and 23 are fixed. Second, control in the θ-axis direction becomes difficult or impossible when acceleration in the X-axis direction is at its maximum.

The output torque T of slider 11 is represented by the following equation:

$$T = Fx2 \cdot Lx2 - Fx1 \cdot Lx1$$

wherein, Fx1 is the propulsion force of X-axis motor 14; Fx2 is the propulsion force of X-axis motor 15; Lx1 is the Y-axis distance from the center of gravity of slider 11 to the center point of X-axis motor 4; and Lx2 is the Y-axis distance from the center point of X-axis motor 15 to the center of gravity of slider 11.

If the load on slider 11 is large and the value of an acceleration/deceleration command signal for the X-axis direction is also large, the propulsion force Fx1 and Fx2 of X-axis motor 14 and 15 are at a maximum. Assuming the maximum values of Fx1 and Fx2 are Fx1max and Fx2max, then the output torque T of slider 11 is $$T = Fx2\text{max} \cdot Lx2 - Fx1\text{max} \cdot Lx1.$$

If Fx1max·Lx1≠Fx2max·Lx2 holds true for reasons of manufacturing variations, for example, then angle θ will also increase. Even when Fx1max·Lx1=Fx2max·Lx2 is true, angle θ will also increase and servo control becomes difficult if not impossible when a disturbing torque Td is applied.

As discussed, in the FIG. 1 apparatus, propulsion force is consumed only for control in the X-axis-direction and no consideration is provided for consuming propulsion force for control in the θ-axis direction. This approach results in an unbalanced maximum propulsion force being applied to the two X-axis motors, or angle of yaw θ increasing when, for example, a disturbing torque interferes. Hence, servo control is difficult if not impossible.

SUMMARY OF THE INVENTION

Accordingly, an object of the invention is to overcome the aforementioned and other problems, disadvantages and deficiencies of the prior art.

The foregoing and other objects are attained by the invention which encompasses a two-dimensional positioning apparatus that provides for position control even when rotational errors occur in the slider of the apparatus by performing control separately in the X-axis and θ-axis directions.

In other aspects of the invention, an interferometer is used with angular frequency being modulated according to amount of movement by an object and multiplied by a reference signal so that a high frequency signal is provided even when the slider is stopped or moved at a low speed; and a motor drive circuit is provided having a feedback control loop that employs a compensation for signals near a zero crossing point so that a deadband near the zero crossing is eliminated; and a return to origin slip plate having two slits arranged in the Y-axis and X-axis directions is provided to detect the position of the slider with the two sliders detecting an interference of laser light, so that a change in wavelength of the laser light, such as due to aging, is detected.

DETAILED DESCRIPTION OF THE PREFERRED EMBODIMENTS

Configuration of the Servo Control System

Figure 1:
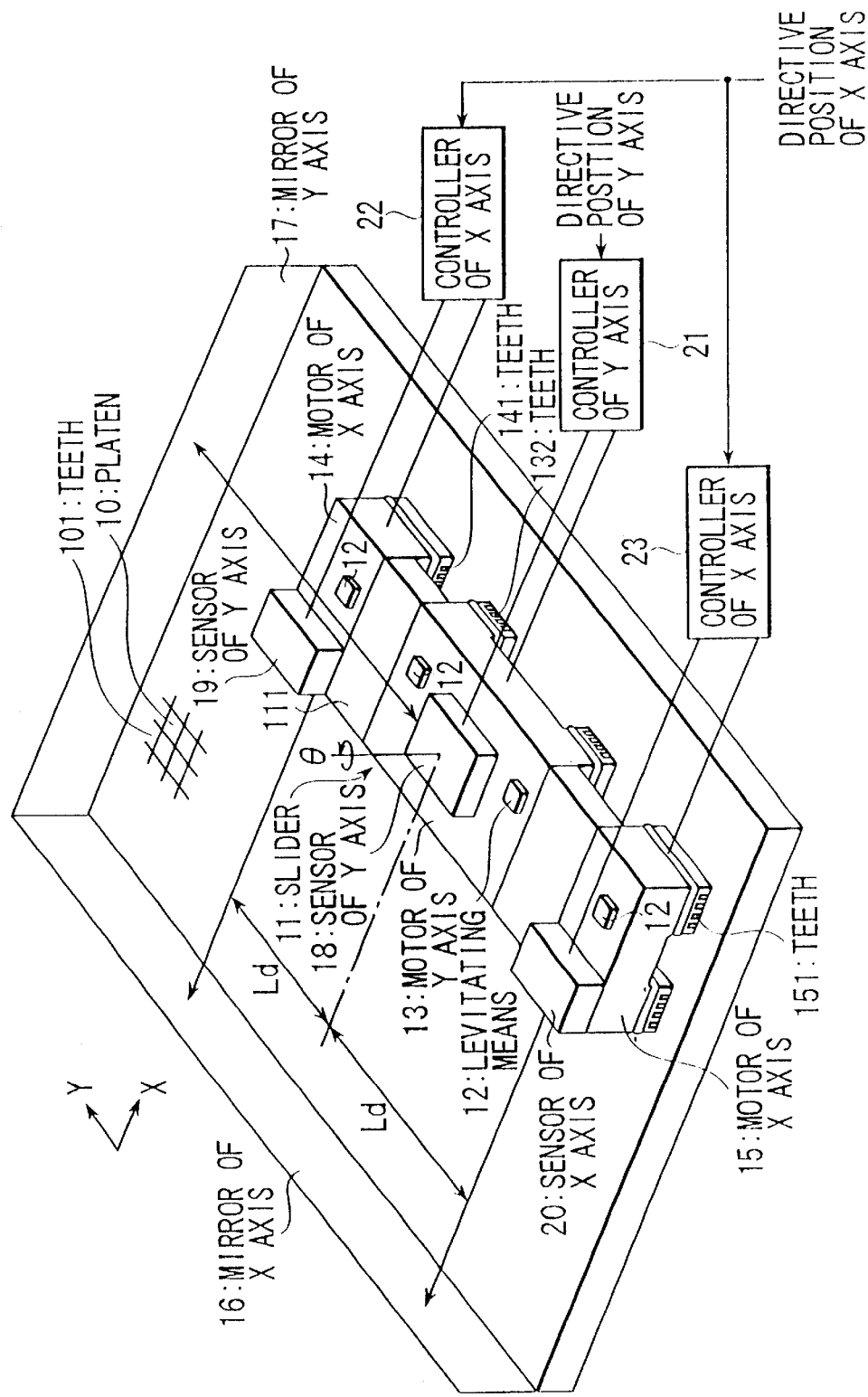
FIG. 1 is a view depicting a prior two-dimensional positioning apparatus.
Figure 2:
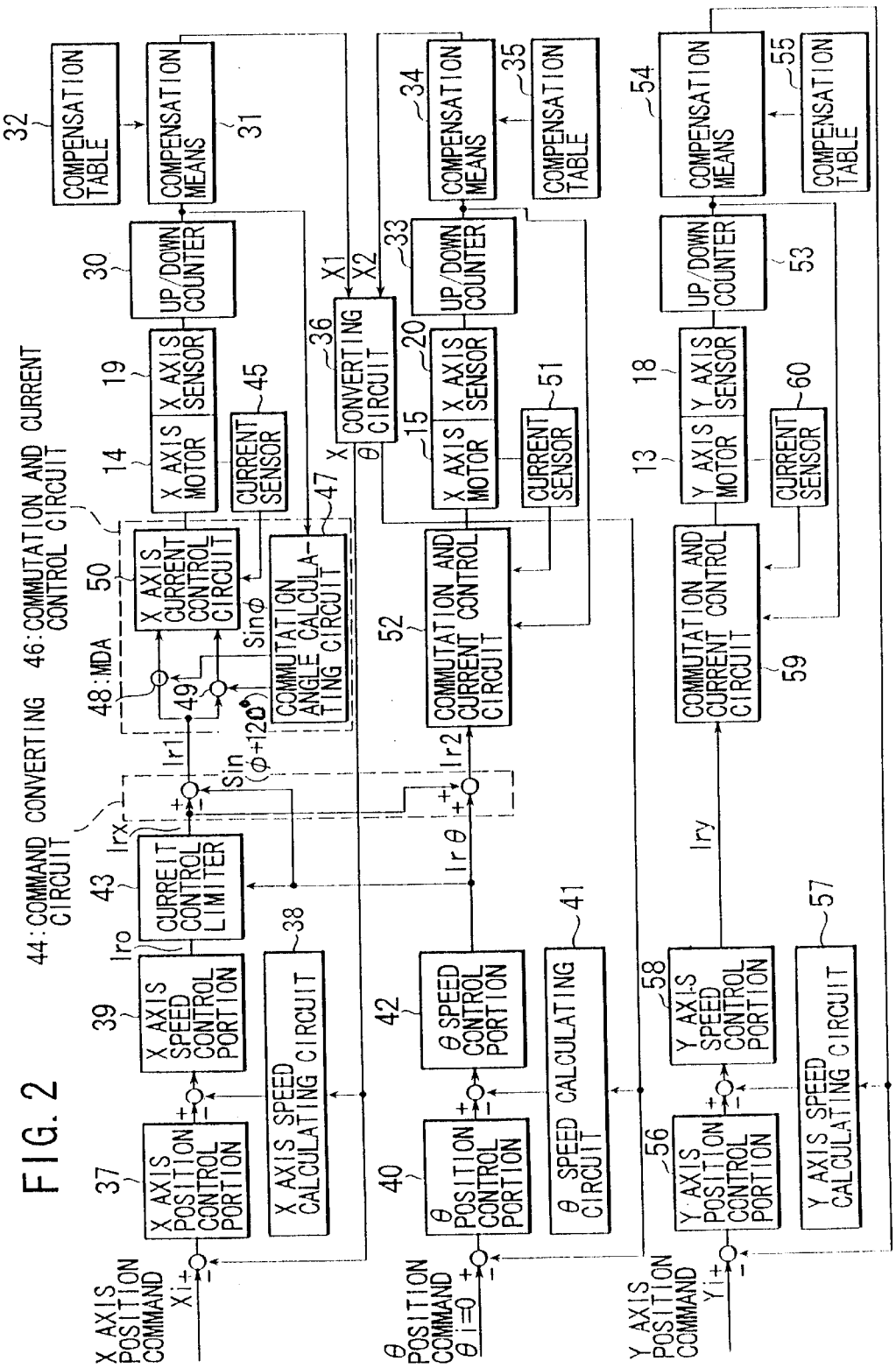
FIG. 2 is a diagram depicting an illustrative embodiment of the invention.

FIG. 2 shows an illustrative embodiment of the invention, wherein elements that are the same as those in FIG. 1 are provided the same reference symbols. FIG. 2 shows a servo control system comprising a platen, a slider, levitating means, X-axis motors, Y-axis motor, X-axis position sensors, Y-axis position sensor, X-axis mirrors and Y-axis mirror which are similar to those shown in FIG. 1. X-axis position sensor 19 identifies the direction in which slider 11 is moved, and generates count-up and count-down pulses depending on the direction in which the slider is moved. The number of pulses generated is relative to the amount of movement by slider 11. An up-down counter 30 counts up or down according to the number of count-up or count-down pulses generated. The count given by up-down counter 30 represents the detected position of slider 11. The configuration of the X-axis position sensor 19 is discussed hereinafter in greater detail.

Compensation means 31 comprises a compensation table 32 wherein positions of slider 11 dependent on the curvature of the mirrors are made to correspond to the amount of correction necessary to eliminate any yawing in the slider 11. Compensation means 31 reads the amount of correction from compensation table 32 according to the directive position provided, and corrects the position detected by the up-down counter 30 using the amount of correction that compensation means 31 reads out. The data contained in compensation table 32 are obtained by calibration. Compensation means 31 is provided to correct curvatures in the X-axis and Y-axis mirrors 16 and 17 due to, for example, mechanical errors. Compensation means 31 need not be provided if the curvatures in the X-axis and Y-axis mirrors 16 and 17 are not such as to affect position detection.

Similar to X-axis position sensor 19, X-axis position sensor 20 is also provided with an up-down counter 33, compensation means 34 and compensation table 35.

Converting circuit 36 receives from compensation means 31 and 34 signals for detected X-axis positions X1 and X2, and converts the signals to signals for the X-axis position "x" of the center point of slider 11 and yaw angle θ of slider 11. The conversion formula is as follows:

$$X=(X1+X2)/2; \theta=(x2-x1)/2Ld$$

wherein, Ld is the distance from the center point of slider 11 to the optical axis of the X-axis position sensor 19 or 20 (see distance Ld in FIG. 1).

An X-axis position controller 37 outputs a control signal for feedback controlling the X-axis position of slider 11 according to the deviation for X-axis position command Xi from the detected position x. From the rate of change in the detected position x, an X-axis speed calculating circuit 38 detects the speed at which slider 11 is moved in the X-axis direction. The X-axis speed calculating circuit 38 is, for example, and F/V converter. Similarly, X-axis speed controller 39 outputs a control signal for feedback controlling the speed at which slider 11 is moved in the X-axis direction, according to the deviation of the control signal of the X-axis position controller 37 from a speed detected by X-axis speed calculating circuit 38. This control signal serves as a propulsion command Ir0 for moving slider 11 in the X-axis direction.

Similarly, the apparatus is provided with a θ-axis position controller 40, θ-axis speed calculating circuit 41, and a θ-axis speed controller 42, to control the yaw angle θ. A control signal provided by O-axis speed controller 42 serves as a propulsion command Irθ for rotating slider 11 in the θ-axis direction.

A limiter 43 restricts the X-axis limits of the propulsion command Ir0 to Imax−|Irθ|, wherein Imax is the maximum value of the propulsion command, and outputs a propulsion command Irx after restriction. This propulsion comman restricts the X-axis limits of the propulsion command Ir0 according to the magnitude of the θ-axis propulsion command Irθ. Then a command converting circuit 44 converts propulsion command Irx for the X-axis direction and propulsion command Irθ for the θ-axis direction to propulsion commands Ir1 and Ir2 for X-axis motors 14 and 15, according to the following formula:

$$Ir1=Irx-Ir\theta; \quad Ir2=Irx+Ir\theta.$$

The propulsion commands Ir1 and Ir2 fall within the range −Imax to +Imax, by virtue of limiter 43.

A current sensor 45 detects an electric current that flows through the coil of X-axis motor 14. A commutation and current control circuit 46 controls the commutation of the X-axis motor 14 and an electric current flowing through the coil of X-axis motor 14.

A commutation angle calculating circuit 47 comprises a sine table containing the counts of the up-down counter 30 and the corresponding sine values. When a count of up-down counter 30 is provided when X-axis motor 14 is of a 3-phase type, the commutation angle calculating circuit 47 reads the values of sin φ and sin (φ+120°) from the sine table. φ is an angle which changes according to the count of up-down counter 30. Multiplying digital-to-analog converters (herein called "MDA") 48 and 49 output current commands Ir1sin φ and Ir1sin (φ+120°), using the propulsion command Ir1 as an analog input signal and the values of sin φ and sin (φ+120°), which were read from the sine table, as gain setting signals. The 120° phase shift in commands occur because the X-axis motor 14 is a 3-phase motor. The phase shift will vary depending on the number of phases.

An X-axis current control circuit 50 controls the electric current flowing through the coil of X-axis motor 14 according to deviations of the current commands Ir1sin φ and Ir1sin (φ+120°) from currents detected by current sensor 45. Similarly, X-axis motor 15 is also provided with current sensor 51 and commutation and current control circuit 52.

Similar to the X-axis and O-axis servo systems, the Y-axis servo control system is also provided with an up-down counter 53, compensation table 55, a Y-axis position controller 56, a Y-axis speed calculating circuit 57, a Y-axis speed controller 58, and a commutation and current control circuit 59. In the Y-axis servo control system, control is provided without converting control variables as is done by converting circuit 36.

The Y-axis components comprise: Y-axis position control portion 56, Y-axis speed control portion 58 to which is applied signal from the Y-axis speed calculating circuit 57, which outputs signal Iry to commutation and current control circuit 59, which then contros Y-axis motor 13 and Y-axis sensor 18, and up/down counter 53 and then to the compensation means 54 which draws upon compensation table 55. Feedback goes through current sensor 60 as depicted. This, is generally similar to the X-axis compents.

Figure 3:
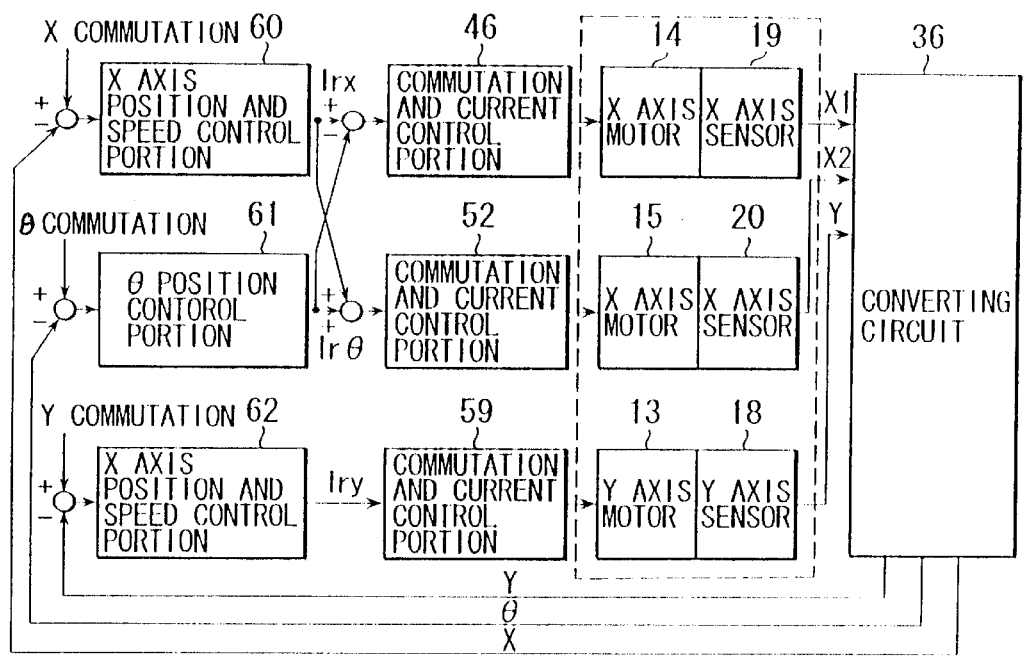
FIG. 3 is a block diagram depicting a simplified control system of FIG. 2.

In FIG. 3, converting circuit 36 converts values X1, X2 and Y detected by X-axis position sensor 19, X-axis position sensor 20 and Y-axis position sensor 18 to the X-axis position x of the center point of slider 11, and yaw angle 9 and Y-axis position Y of slider 11. An X-axis position and speed controller 60 feedback controls the X-axis position and speed slider 11 using the signal of position x as a feedback signal. The control signal of the X-axis position and speed controller 60 is outputted as a propulsion command Irx for the X-axis direction. A θ-axis position and speed controller 61 feedback controls the θ-axis position and speed of slider 11 using the signal of yaw angle θ as a feedback signal. The control signal of the θ-axis position and speed controller 61 is outputted as a propulsion command Irθ for the θ-axis direction. At this point, the propulsion commands Irx and Irθ are converted to Irx−Irθ and Irx+Irθ, i.e. the propulsion commands for X-axis motors 14 and 15. Thus, the X-axis direction and θ-axis direction are controlled separately.

A Y-axis position and speed controller 62 feedback controls the Y-axis position and speed of slider 11 using the signal for the position Y as a feedback signal. the control signal for the Y-axis position and speed controller 62 is outputted as a propulsion command Iry for control of the Y-axis direction.

The above embodiment has many advantages, such as (1) Signals detected by Y-axis position sensor and two X-axis position sensors are converted to the X-axis position signal for the center point of slider 11 and the signal for yaw angle θ of slider 11. Then according to the converted signals, the movement of slider 11 in the X-axis direction and θ-axis direction are feedback controlled separately. Thus, it is possible to determine the control method and servo gain for the θ-axis direction separately from the control method and servo gain for the X-axis direction. Accordingly, the θ-axis servo-mechanical rigidity is improved and servo control is provided substantially free of rotational error in slider 11. Moreover, positioning accuracy for the direction of yawing is dramatically improved.

(2) In response to propulsion commands for the x-axis direction and the θ-axis direction, the sum and difference of the propulsion commands are evaluated to generate propulsion commands for the first and second X-axis motors. Thus, propulsion commands may be provided to the two X-axis motors concurrently with the satisfaction of conditions wherein control tasks for the X-axis and θ-axis directions do not interfere with each other.

(3) The X-axis limits of the propulsion command Ir0 are restricted to Imax−|Irθ|, wherein Imax is the maximum value of the propulsion command. Accordingly, the X-axis limits of the propulsion command Ir0 are restricted by the magnitude of the θ-axis propulsion command Irθ. Hence, priority may be provided to control in the θ-axis direction over control in the X-axis direction. Moreover, control in the θ-axis direction is not affected by control in the X-axis direction. Hence, it is possible to maintain control characteristics even when the servo control system is under a heavy load and/or intense acceleration and/or deceleration.

Configuration of the Motor Cores

Figure 4:
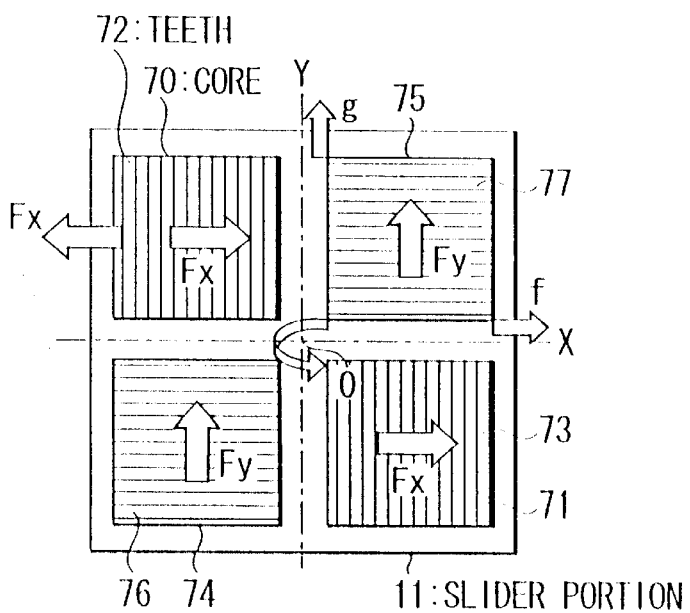
FIG. 4 is a view depicting an example of motor cores disposed in the X-axis and Y-axis motors.

FIG. 4 depicts a motor core arrangement wherein teeth 72 and 73 are formed on cores 70 and 71 of X-axis motors 14 and 15, at fixed spacings along an X-axis. Cores 70 and 71 are arranged symmetrically around a center point 0 of slider 11. Similarly, teeth 76 and 77 are formed on cores 74 and 75 of Y-axis motor 13, at fixed spacings along the Y-axis. Teeth 72,73,16 and 77 are arranged opposite to the teeth of platen 10.

When cores 70 and 71 produce propulsion force Fx, slider 11 is moved in direction f. When core 70 produces propulsion force -Fx, and core 71 produces propulsion force Fx, slider 11 is rotated in direction θ1 (see broad arrow). When cores 73 and 74 produce propulsion force Fy, slider 11 is moved in direction g.

In FIG. 4, the teeth of the two X-axis motors are arranged symmetrically around the center point of slider 11. Hence, the positional errors of the teeth of the two X axes due to thermal expansion are almost equal, and hence will cancel each other. Thus, errors due to temperature change effects on the motors are reduced.

Figure 5:
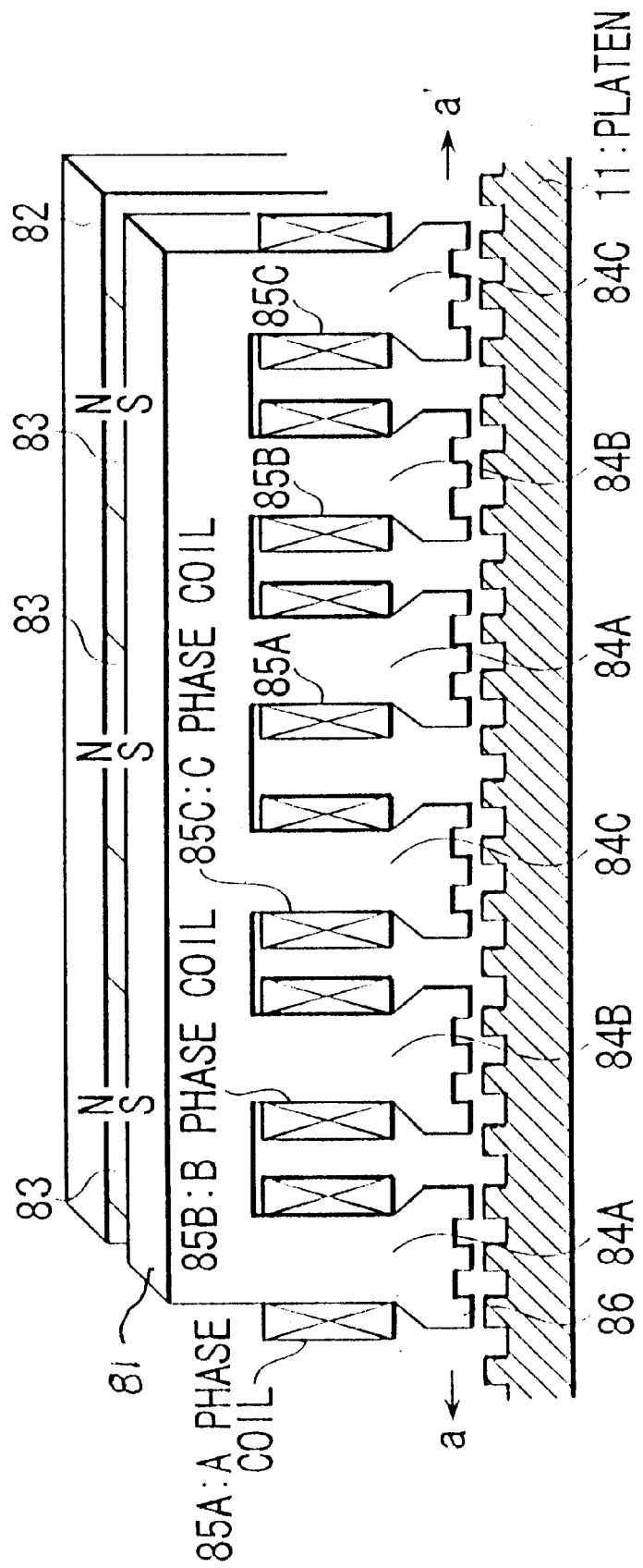
FIG. 5 is a pictorial view depicting an example of motor cores disposed in the X-axis and Y-axis motors.

FIG. 5 depicts a motor core arrangement, wherein motor cores 81 and 82 are arranged so as to sandwich a plurality of permanent magnets 83. Permanent magnets 83 are magnetized in a direction in which the motor cores are arranged. Motor core 81 is provided with the windings of phase-A coils 85A, phase-B coils 85B, and phase-C coils 85C, in the order in which salient poles 84A, 84B, and 85C are arranged. The coils are wound so as to span the respective salient poles of the two motor cores 81 and 82. On the tip of each salient pole, teeth are formed at a pitch P. The teeth of salient poles 84A, 84B, and 84C have a phase shift of P/3 between each other. Hence, sine-wave currents having a phase shift of 120° between each other are applied to the phase-A coils 84A, phase-B coils 84B and phase-C coils 84C.

Motor core 82 has a configuration similar to that of the motor core 81. The teeth of salient poles on motor core 82 are arranged with a phase shift of P/3 between each other and the teeth of motor core 81. Motor cores 81 and 82 are moved in the a–a' direction when a 3-phase sine-wave current is applied to the phase-A coils 84A, phase-B coils 84B and phase-C coils 84C. The motor cores shown in FIG. 5 correspond to the single motor core shown in FIG. 4.

Configuration of Sensors

Figure 6:
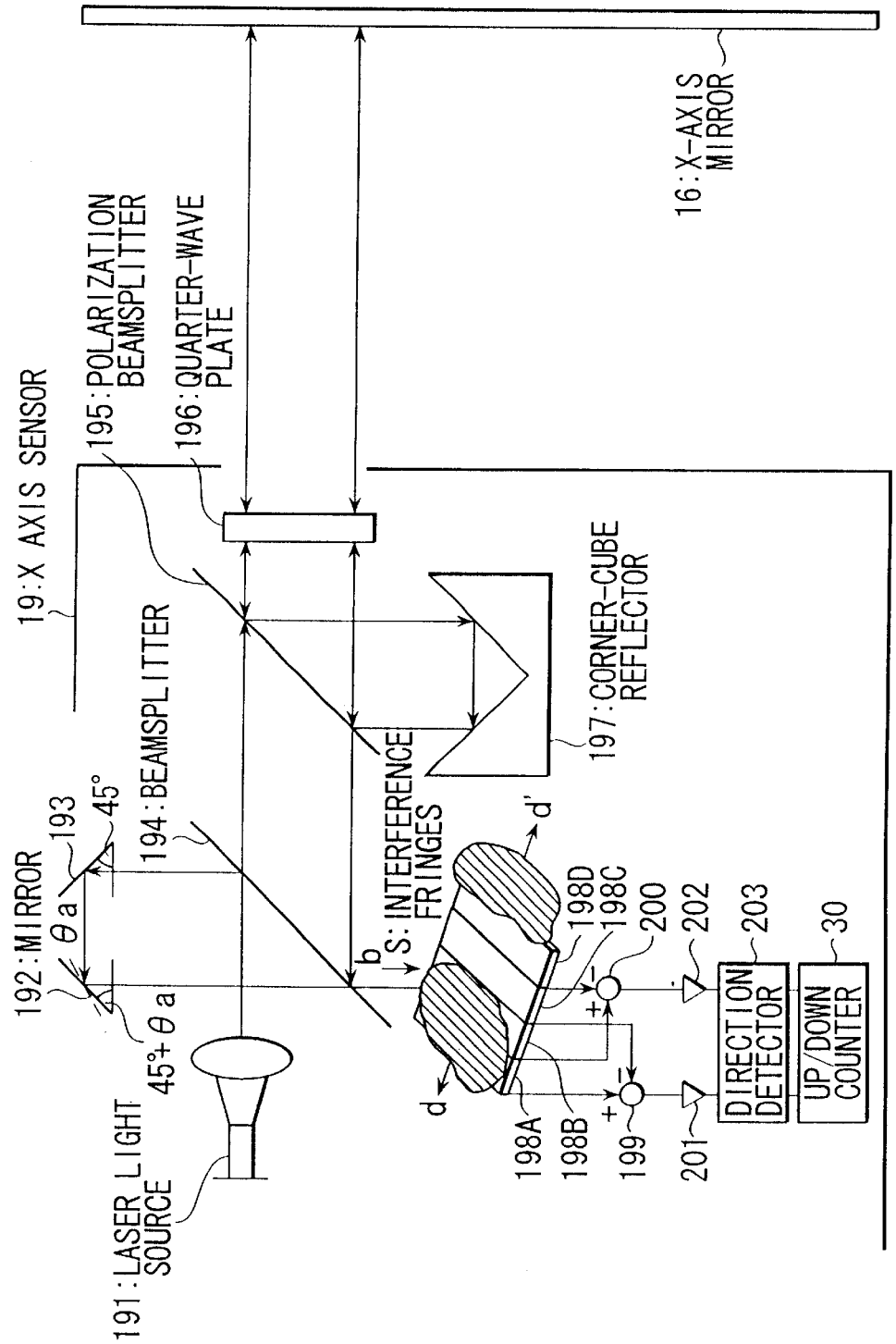
FIG. 6 is a view depicting an example of sensors used in the embodiment of FIG. 2.

FIG. 6 shows an example of sensors used in the embodiment of FIG. 2, wherein Y-axis position sensor 18 and X-axis position sensors 19 and 20 are similar, and wherein X-axis position sensor 19 is shown as an example in the below discussion. In the embodiment of FIG. 6, a laser light source 191 emits laser light in an optical path comprising mirrors 192 and 193, a half mirror 194, a polarization beam splitter (called "PBS") 195, a quarter-wave plate 196, and a corner cube reflector (called "corner cube") 197. One light beam, among a plurality of light beams emitted by source 191, is caused to travel along the path comprising half mirror 194, mirror 193, mirror 192, and half mirror 194, thereby advancing in the direction b. The light beam may be considered as light beam "1". On the other hand, another light beam is caused to travel along the path comprising half mirror 194, PBS 195, quarter-wave plate 196, X-axis mirror 16, quarter-wave plate 196, PBS 195, corner cube 197, quarter-wave plate 196, x-axis mirror 16, quarter-wave plate 196, PBS 195, and half mirror 194, thus also advancing in the direction b. This light beam may be considered as light beam "2".

Mirror 193 is arranged at an angle of 45° to the optical axis of the laser light source 191. On the other hand, half mirror 194 is arranged at an angle of 45°+θa to the optical axis. The angle difference of θa of half mirror 194 causes the wavefront of the light beam "1" to differ from that of the light beam "2" by as much as θa. Hence, light beams "1" and "2" interfere with each other and form interference fringes S. A photo diode array (called "PDA") 198 detects the interference fringes S. The PDA 198 comprises four photodiodes 198A–198D, which are disposed within a single pitch of the interference fringes S and are arranged at an equal spacing of p/4, wherein p is the pitch of the interference fringes.

In such case, the following relationship holds:

Pitch p of the interference fringes=λ/θa, wherein λ is the wavelength of the laser light.

A subtractor 199 calculates "(signal detected by photodiode 198A)–(signal detected by photodiode 198C)". Similarly, substractor 200 calculates "(signal detected by photodiode 198B)–(signal detected by photodiode 198D)"

X-axis position sensor 19 is moved when slider 11 is moved, thereby causing the interference fringes to be moved in the d–d' direction, as shown in FIG. 6. The light and dark bands of the interference fringes which are exposed to each of the photodiodes 198A–198D, are also moved when the interference fringes are moved, thereby causing the values detected by photodiodes 198A–198D to change. The position of slider 11 is detected according to the changes. When the interference fringes are moved in the direction d, the outputs VA–VD from the photodiodes are as follows:

$$VA=K[1+m\sin\{xe\cdot2\pi/(\lambda/4)\}]+Kn$$

$$VB=K[1+m\cos\{xe\cdot2\pi/(\lambda/4)\}]+Kn$$

$$VC=K[1-m\sin\{xe\cdot2\pi/(\lambda/4)\}]+Kn$$

$$VD=K[1-m\cos\{xe\cdot2\pi/(\lambda/4)\}]+Kn,$$

wherein xe is the distance of the object being detected; K and m are coefficients; and Kn is a noise component.

The signals from subtractors 199 and 200 are as follows:

$$VA-VC=2mK\sin[xe\cdot2\pi/(\lambda/4)]$$

$$VB-VD=2mK\cos[xe\cdot2\pi/(\lambda/4)]$$

As a result of the subtraction, the dc noise component Kn, that occurs due to disturbing light, is cancelled. The signals VA–VC and VB–VD are converted to the phase-A and phase-B pulses. If the interference fringes are moved in direction d', the phase relationship between signals VA–VC and VB–VD is reversed. Comparators 201 and 202 generate the phase-A and phase-B pulses from the subtraction signals outputted by subtractors 199 and 200. From the phase relationship between phase-A and phase-B pulses, a direction detector 203 identifies the direction in which slider 11 is moved, thereby to generate count-up or count-down pulses depending on the results of the identification.

The up-down counter 30 counts up or down according to the generated count-up or count-down pulses. The count of the up-down counter 30 represents the position detected by slider 11.

The phases of teeth on the rotor and stator of the X-axis motor 14 will be shifted under the initial conditions when a current is applied to each coil having a different phase. The value of the up-down counter 30 at this point is set to 0, for example, as a reference value. The up-down counter 30 counts up or down from the reference value as slider 11 is moved, thereby to detect the position of the slider 11. Accordingly, the position of slider 11 is detected in an incremental manner.

Configuration of Another Sensor

Figure 7:
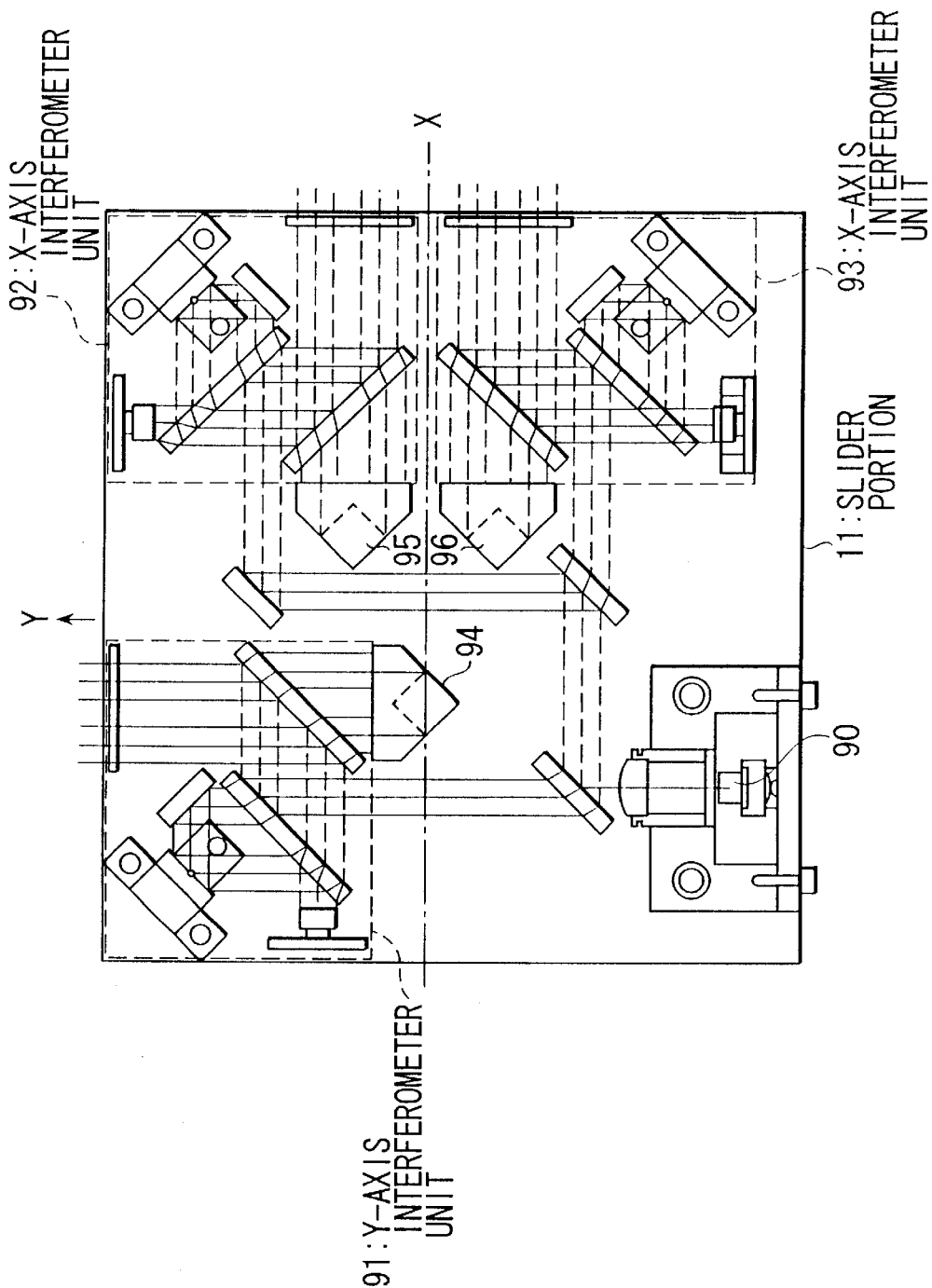
FIG. 7 is a view depicting another example of sensors used in the embodiment of FIG. 2.

FIG. 7 shows another example of sensors used in the embodiment of FIG. 2, wherein a laser light source 90 is common to Y-axis position sensor 18 and X-axis position sensors 19 and 20. A Y-axis interferometer unit 91 and X-axis interferometer units 92 and 93 comprise the Y-position sensor 18 and X-axis position sensors 19 and 20, respectively. Y-axis interferometer unit 91 and X-axis interferometer units 92 and 93 emit laser light in the Y-axis and X-axis directions, respectively. Then, positions are determined optically from light beams reflected by Y-axis mirror 17 and X-axis mirror 16. Y-axis position sensor 18 and X-axis sensors 19 and 20 are provided with corner cubes 94, 95 and 96, respectively.

The corner cube reflector 94 of Y-axis position sensor 18 is positioned at a Y-axis center point of slider 11. The corner cube refectors 95 and 96 of X-axis position sensors 19 and 20 are arranged symmetrically around an X-axis center line of slider 11. This arrangement of corner cubes-results in positional errors of the corner cubes which errors are almost equal, when there is thermal expansion of slider 11.

Accordingly, the effects of thermal expansion on the sensors are reduced by the invention.

Configuration of a Further Sensor

Figure 8:
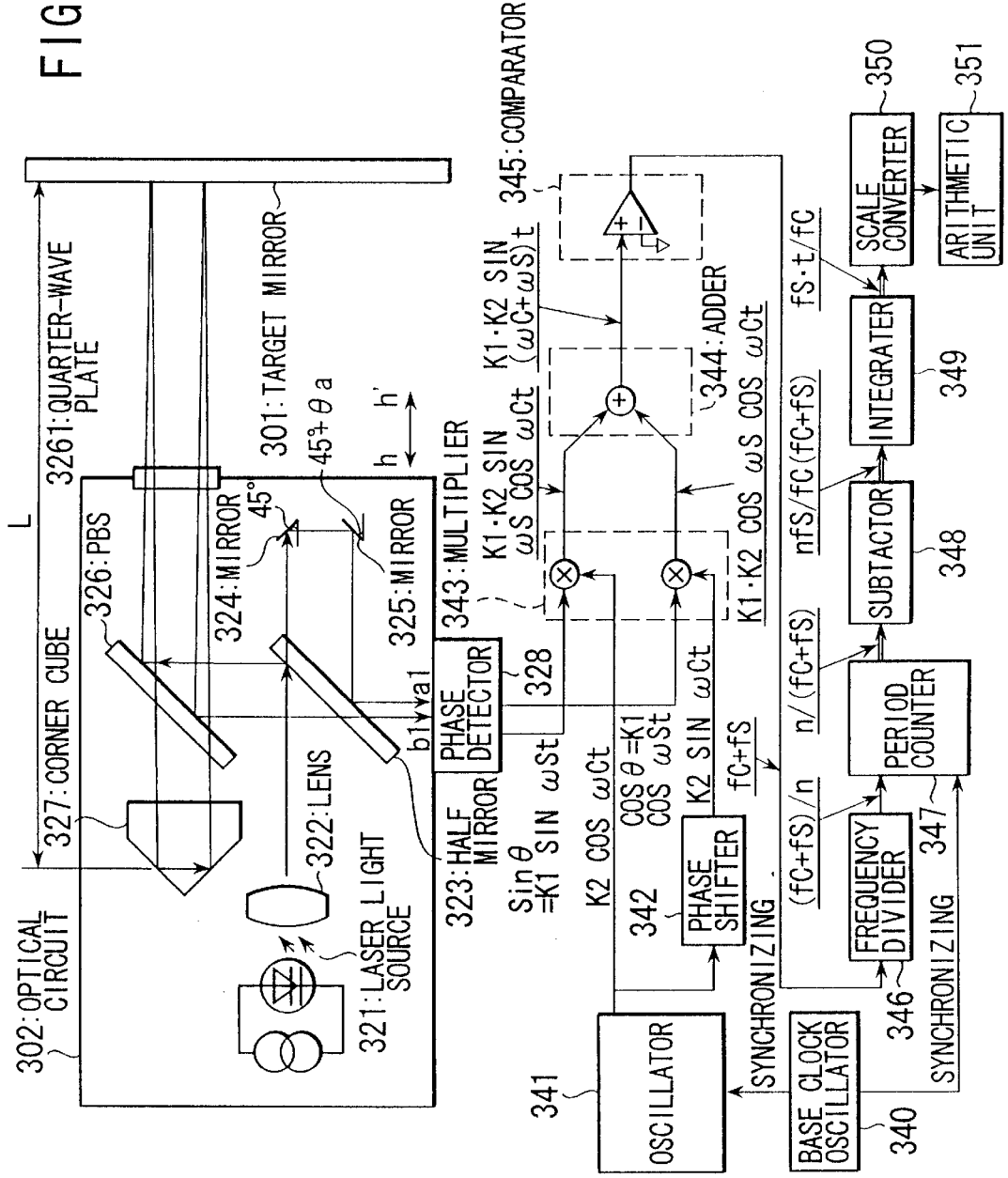
FIG. 8 is a view depicting still another example of sensors used in the embodiment of FIG. 2.

FIG. 8 is another example of sensors used in the embodiment of FIG. 2, wherein a target mirror 301 is fixed and an optical circuit 302 is moved in the h–h' direction along with the object being detected (not shown). A laser light source 321 emits laser light having a polarimetric component perpendicular to the plane of the sheet of drawing. A lens 322 changes the beams emitted by the source 321 to be parallel beams. A half mirror 323 separates the light beams that have passed through lens 322, into transmitted and reflected light beams. Fixed mirrors 324 and 325 receive the transmitted light beam from half mirror 323 and reflect the beam back to half mirror 323. Mirror 324 is arranged at an angle of 45° to the optical axis of the laser light source 321. On the other hand, mirror 325 is arranged at an angle of 45°+θa to the optical axis.

A polarization beam splitter (called "PBS") 326 reflects back the light beam that is reflected by half mirror 323. The reflected light beam is passed through a quarter-wave plate 3261 and is advanced to target mirror 301. The light beam is passed through quarter-wave plate 3261 twice, whereat the beam is changed from a vertically polarized light to a horizontally polarized light, and then vice versa. Use of the quarter-wave plate 3261 enables the selection of the transmitted and reflected light beams using the PBS 326.

The corner cube 327 reflects the light that has been reflected by target mirror 301, and then is transmitted through quarter-wave plate 3261 and PBS 326, to cuase the light to travel back to PBS 326.

A phase detector 328 detects the interference fringes produced by the light which is returned to half mirror 323. The distance between target mirror 301 and corner cube 327 is assumed to be L. In the position sensor of FIG. 8, part of the ligh beams emitted by source 321 follows the following path: (1) Lens 322→half mirror 323→mirror 324→mirror 325→half mirror 323→phase detector 328. This light beam may be considered as light beam "1". (2) Lens 322→half mirror 323→PBS 326→quarter-wave plate 3261→target mirror 301→quarter-wave plate 3261→PBS 326→corner cube 327→PBS 326→quarter-wave plate 3261→target mirror 301→quarter-wave plate 3261→PBS 326→half mirror 323→phase detector 328. This light beam may be considered as light beam "2".

The angle at which mirror 325 is positioned is shifted by as much as θa from that of mirror 324. Thus, the wavefront of a light beam "a" that has returned after following the path of light beam "1" also is shifted by as much as θa from that of a light beam "b" that has returned after following the path of light beam "2". This wavefront shift causes light beams a1 and b1 to interfere with each other to produce interference fringes S. The pattern of the interference fringes S is shown in FIG. 9, wherein the pitch P of the interference fringes S is given by the following formula:

P=λ/θa, wherein λ is the wavelength of laser light. The phase detector 328 detects the interference fringes by means of a pair of photo detectors that are arranged, with a phase shift of as much as P/4 pitch from each other, in the direction in which the interference fringes are aligned. The photodetectors may be, for example, photo diodes.

Figure 9:
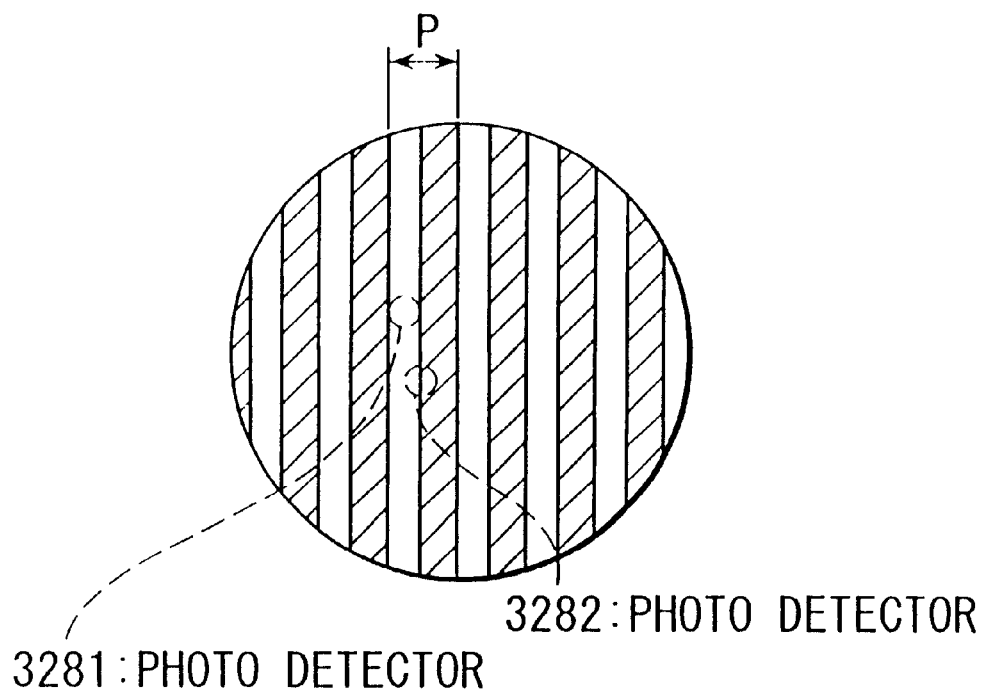
FIG. 9 is a view depicting a pattern of interference fringes.

FIG. 9 shows how the two photo detectors 3281 and 3282 are arranged. The two photo detectors 3281 and 3282 produce signals which correspond to the amount of light received thereby. Signals detected by photo detectors 3281 and 3282 are represented as K1sinθ and K1cosθ, wherein K1 is a constant and θ is a phase, respectively. The phase θ is modulated according to the amount of movement ΔL by optical circuit 302. θ is given by the following:

$$\theta = 2\pi \cdot 4\Delta L/\lambda \quad (1)$$

The number 4 is contained in above formula (1) because a light beam makes two round trips between target mirror 1 and corner cube 327. Hence, the optical length changes by as much as 4ΔL when optical circuit 302 is moved by as much as ΔL.

From above formula (1), the amount of movement ΔL is given by the following:

$$\Delta L = \theta/8\pi \quad (2)$$

For purposes of explanation, it is assumed that the optical circuit 302 is moved at a constant speed of V along with the object being detected. The phase detector 328 outputs signals K1sinθ and K1cosθ. Since the optical circuit 302 is moved at a constant speed, K1sinθ=K1sinωst and K1cosθ=K1cosωst, wherein ωs is an angular frequency and t is time, holds true. Under these conditions, ΔL=Vt holds true. From above equation (1), the following equation is obtained:

$$\theta = 2\pi \cdot 4\Delta L/\lambda$$

$$= 2\pi \cdot 4Vt/\lambda$$

$$= 8\pi \cdot Vt/\lambda$$

Since θ=ωst, the following equation holds true:

$$s = 8\pi \cdot V/\lambda$$

Assuming ωs=2πfs, wherein fs is frequency, then $$fs = 4V/\lambda \quad (3)$$

A base clock oscillator 340 generates a base clock signal whose frequency is sufficiently higher than frequency fc. An oscillator 341 generates signal K2cosωct, wherein K2 is a constant, and ωc>>ωs, from the base clock. A phase shifter 342 shifts the phase of signal K2cosωct, thereby producing signal K2sinωct.

A multiplier 343 multiplies modulated signals K1sinωst and K1cosωst by reference signals K2cosωct and K2sinωct, respectively. An adder 344 adds the two multiplication signals to obtain signal K1·K2sin(ωc+ωs)t. A comparator 345 converts the addition signal to a pulse signal. A frequency divider 346 divides the frequency of the pulse signal by a dividing ratio n, wherein n is an integer. Hence, the frequency divider 346 provides a signal whose frequency is $$(fc+fs)/n(\omega c = 2\pi fc).$$

A period counter 347 measures the period n/(fs+fc) of the frequency divided signal received from frequency divider 346, using the base clock. Since the frequency of the base clock is sufficiently high compared with (fc+fs)/n, the period is measured with high resolution. The period may be measured using a clock other than the base clock. Any measuring clock would be acceptable as long as the period thereof is sufficiently short compared to the period n/(fs+fc) of the frequency divided signal.

A subtractor 348 calculates the difference between period n/fc of the reference signal and measured period n/(fs+fc) of the period counter 347. This provides the period difference nfs/fc(fs+fc).

An integrator 349 integrates the period difference nfs/fc (fs+fc) of subtractor 348 at intervals n/(fs+fc). This provides the integral value fst/fc. A scale converter 350 multiplies integral value fst/fc by λfc/4 to calculate the distance ΔL. From equation (3) the travel distance ΔL is calculated as follows:

$$fst/fc \times \lambda fc/4$$
$$= 4V/\lambda \times t/fc \times \lambda fc/4$$
$$= Vt$$
$$= \Delta L.$$

An arithmetic unit 351 calculates the position of the object being detected from the distance ΔL. The term "position calculation means" may refer to the scale converter 350 and arithmetic unit 351.

The direction in which the object is moved varies as the polarity of ωs changes depending on the phase lead or lag relationship between the two modulated signals K1sinωst and K1cosωst. Hence, the direction is determined by judging whether the frequency fs+fc is higher or lower than fc.

The sensors may be configured so that (1) multiplier 343 multiplies modulated signals K1sinωst and K1cosωst by reference signals K2sinωct and K2cosωct, respectively, and (2) adder 344 adds the two multiplication signals, thereby providing the signal K1·K2cos(ωc ωs)t.

Although in this embodiment, the optical circuit 302 is moved, the target mirror may be made to move instead and optical circuit 302 fixed.

The embodiment provides the following and other advantages:

(1) Two signals that have been modulated according to the distance moved by an object being detected are multiplied by their respective reference signals generated from the base clock. Then, the two multiplication signals are added to produce a signal having a frequency which is sufficiently high compared to the frequencies of the modulated signals. Accordingly, the high frequency signal is also inputted to a comparator for pulsing the high frequency signal when the object is at a stop or being moved at a low speed. Hence, the comparator need not have a hysteresis characteristic. The absence of the hysteresis characteristic ensures that the position sensor does not malfunction even when the amplitude of the comparator input is varied.

(2) An arithmetic process is applied to a signal obtained from the phase detector to convert the signal to a high frequency signal, before the initial signal is inputted to the comparator. Accordingly, a high frequency signal is also inputted to the comparator when the object is at a stop or moved at a low speed. Hence, the comparator does not have to have a hysteresis characteristic. The absence of such hysteresis characteristic ensures that the position sensor will not malfunction even when the amplitude of the comparator input is varied. Also, since the signal of the phase detector is divided before the period of the signal is measured, the position sensor is not affected by the duty cycle distortions in the comparator. Hence, the position sensor is prevented from malfunctioning when the phase detector output is changed suddenly.

(3) Signals which are modulated in terms of the periods thereof according to the distance travelled by an object are generated. Then, the periods of the modulated signals are measured using a measuring clock having a period which is sufficiently short compared to the foregoing periods, thereby detecting the position of the object. Accordingly, the position can be detected with high accuracy.

(4) The base clock is designed for use commonly by (1) the phase detector and the period counter to generate a signal by which the output of the phase detector is multiplied, and (2) as a measuring clock for the period counter. Hence, it is possible to accurately synchronize the output of the phase detector with the timing of the period measurement.

Configuration of the Motor Drive Circuit

One Example of Motor Drive Circuit

Figure 10:
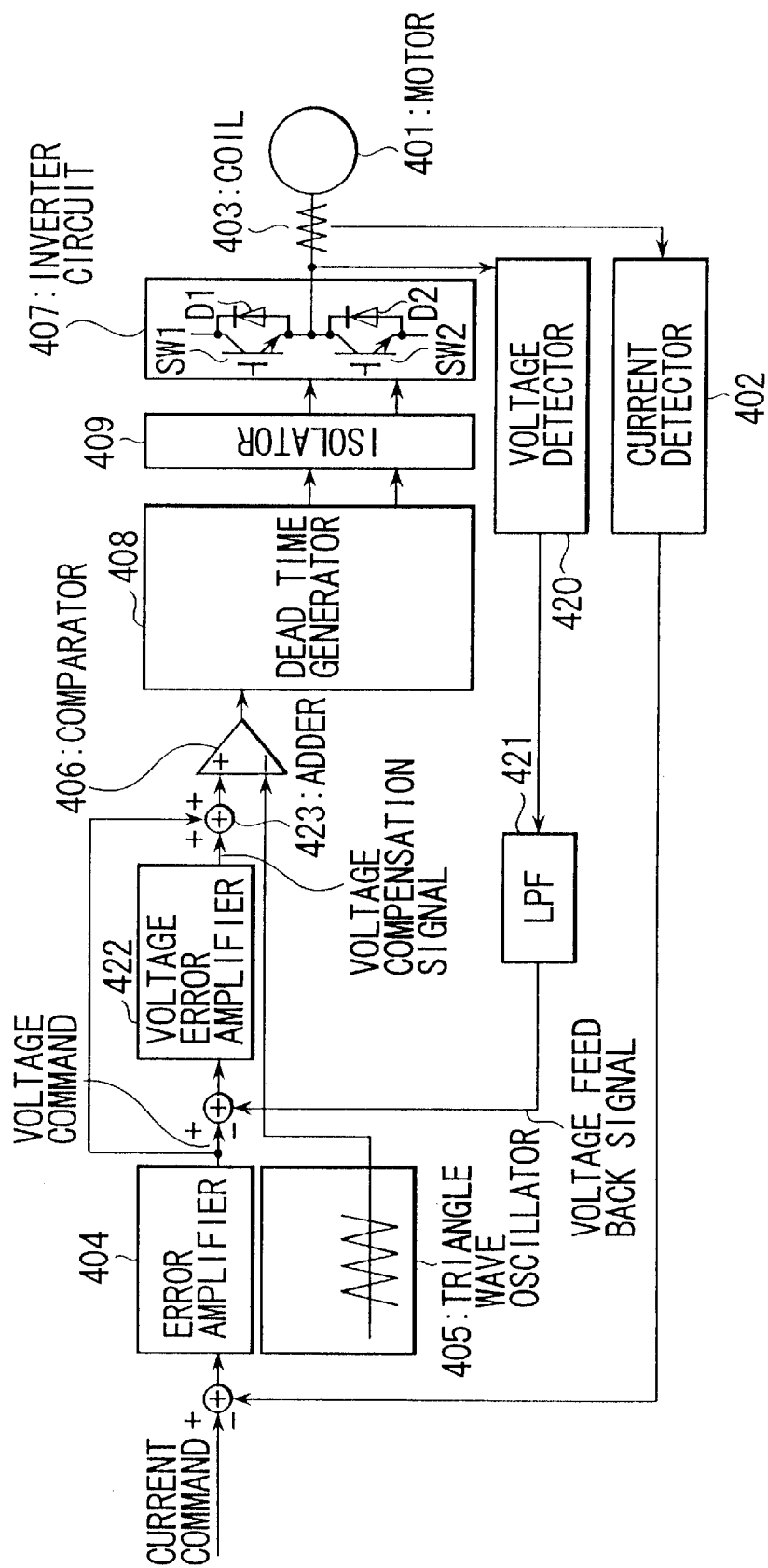
FIG. 10 is a diagram depicting an example of a motor drive circuit used in the embodiment of FIG. 2.

FIG. 10 shows an example of a motor drive circuit used in the embodiment of FIG. 2, wherein a motor 401 is, for example, a pulse motor. A current detector 402 detects the magnitude of the electric current flowing through coil 403 of motor 401, in an electrically isolated manner, to feed back a detected signal.

A current error amplifier 404 calculates and amplifies the difference between a current command provided by a control command and the detected signal representing the electric current detected by current detector 402. Thus, current error amplifier 404 outputs an amplified signal as a voltage command. The calculation described above is, for example, an integration function. A triangular wave oscillator 405 generates a triangular wave signal for producing a pulse width modulated (PWM) signal. A comparator 406 compares the voltage command signal from the current error amplifier 404 with a triangular wave signal from the triangular wave oscillator 405, to generate a PWM signal.

A bridge type inverter circuit 407 comprises two switches SW1 and SW2 connected in series with the connection point thereof being connected to coil 403 of motor 401 to cause electric current to flow through the coil 403 upon the turning "ON" and "OFF" of switches SW1 and SW2. The switches SW1 and SW2 comprise, for example, transistors. Diodes D1 and D2 are connected in parallel to switches SW1 and SW2.

A dead time generator 408 generates a switch control signal for turning ON and OFF switches SW1 and SW2 from a PWM signal supplied by comparator 406. A dead time is set in the switch control signal to prevent switches SW1 and SW2 from being turned ON simultaneously. If the switches SW1 and SW2 are turned ON simultaneously, a large current will flow through switches SW1 and SW2, thereby causing damage thereto. An isolator 409 is provided to isolate inverter circuit 407 from dead time generator 408. Thus, the PWM signal outputted by dead time generator 408 is transmitted to inverter circuit 407 is an electrically isolated manner. The switches SW1 and SW2 are turned ON and OFF by the transmitted PWM signal, thereby causing the electric current to flow through the coil 403.

The output voltage from inverter circuit 407 is a rectangular wave signal and the voltage mean value thereof is proportional to the output signal from current error amplifier 404. The output voltage from inverter circuit 407 turns ON an electric current through motor 401 and an electric current feedback signal is obtained by current detector 402 to form a feedback loop which is a constant current loop. A voltage detector 420 detects the output voltage from inverter circuit 407 and is, for example, an electrically isolated detector. A low pass filter (LPF) 421 cuts off the PWM noise contained in the output signal from the voltage detector 420 which output signal is a voltage feedback signal.

A voltage error amplifier 422 amplifies the difference between a voltage command signal provided by the voltage command signal from current error amplifier 404 and a voltage value detected by voltage detector 420. Thus, the voltage error amplifier 422 outputs an amplified signal which is a voltage compensation signal. An adder 423 adds the voltage compensation signal to the voltage command signal to compensate the voltage command signal. Then, adder 423 feeds the compensated voltage command signal to comparator 406. The addition signal is compared with a triangular wave signal from triangular wave oscillator 405 to generate a PWM signal.

In the embodiment of FIG. 10, the output voltage from inverter circuit 407 is fed back, a voltage compensation signal is produced from the fed back signal, and a voltage command signal is compensated by the voltage compensation signal. Hence, errors are reduced that may occur due to a dead band in the output voltage from inverter circuit 407 when the direction of the electric current is changed.

Configuration of Another Motor Drive Circuit

Figure 11:
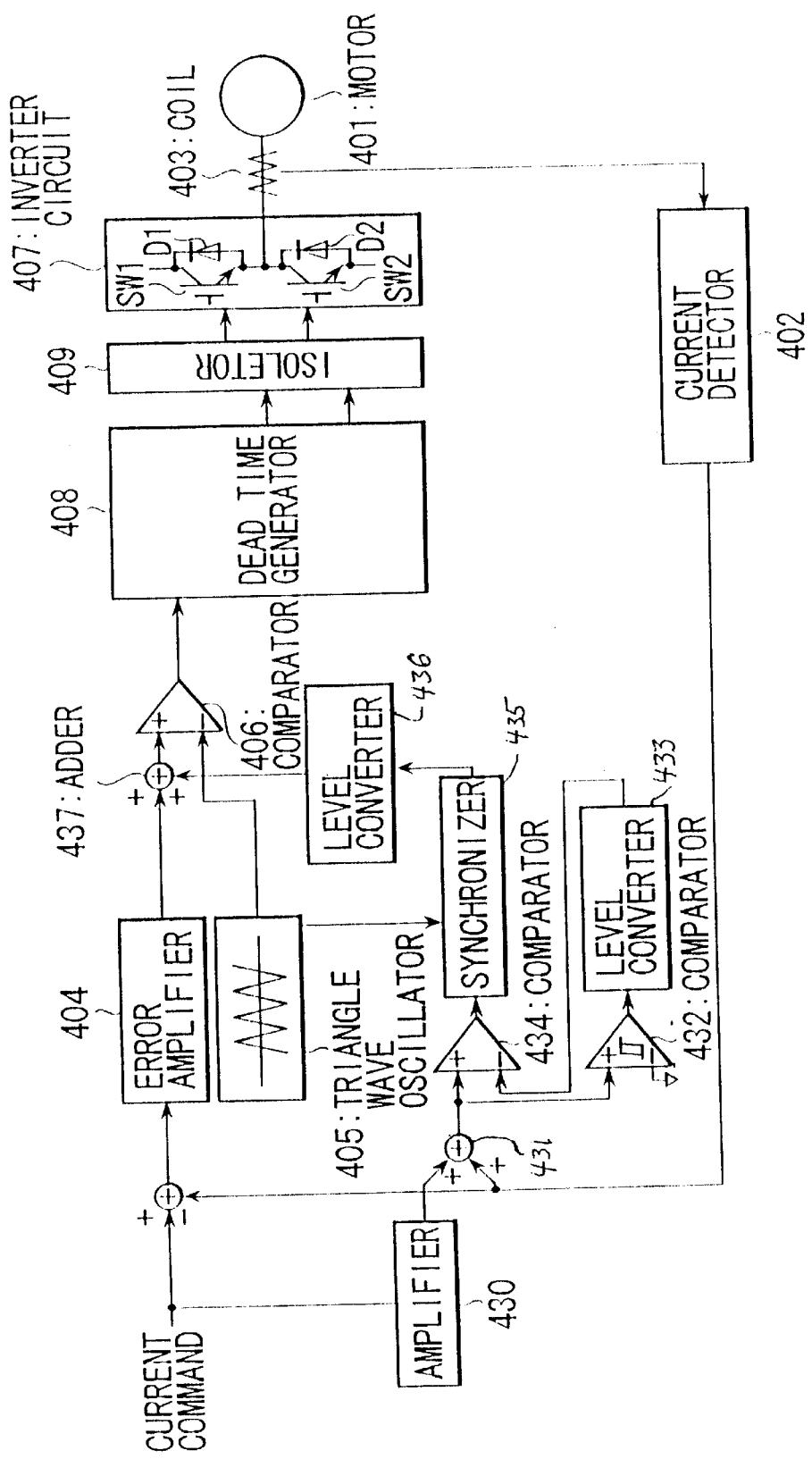
FIG. 11 is a diagram depicting another example of a motor drive circuit used in the embodiment of FIG. 2.

FIG. 11 shows another example of a motor drive circuit used in the embodiment of FIG. 2, wherein an amplifier 430 amplifies a current command signal provided by the control command. An adder 431 adds the amplified signal from amplifier 430 and the current feedback signal from current detector 402, to produce a monitor signal. This addition provides an average of the two signals. A comparator 432 compares the level of the monitor signal from adder 431 with a given reference value to detect the direction, i.e. polarity, of the electric current. The comparator 432 is a hysteresis based comparator. A level converter 433 sets the output from comparator 432 to a level for detecting a zero crossing point corresponding to the direction of the electric current. A comparator 434 compares the level of the monitor signal from adder 431 with the level set by level converter 433 to detect a zero crossing point corresponding to the direction of the electric current. The direction of the electric current is either when the current changes from positive to negative or when the current changes from negative to positive. A synchronizer 435 synchronizes the output from comparator 434 with the triangular wave signal from triangular wave oscillator 405. The synchronizer 435 comprises a plurality of flip-flop circuits.

Since the current feedback signal outputted by current detector 402 has a lag against the control command, the monitor signal from adder 431 has a phase lead against an actual electric current supplied to coil 403. This phase lead is determined by the gain of amplifier 430. The gain of amplifier 430 is adjusted suitably to produce an optimum timing for compensating a deadband near a zero crossing point. Additionally, the reference input signal, with which the compensation of a deadband near a zero crossing point begins, is adjusted to the optimum level by adjusting the level of the level converter 433.

The output from comparator 434 is synchronized with a triangular wave signal by the synchronizer 435, and the is inputted to the level converter 436. The level converter 436 is set to a level for comensating the output voltage from inverter circuit 407 near the zero crossing point. Hence, the level converter 436 produces a signal which is adjusted so as to compensate for a change in the duty ratio of the output signal from inverter circuit 407. An adder 437 adds the output signal from the level converter 436 to the voltage command signal from current error amplifier 404 to compensate the voltage command. Hence, any change in the duty ratio of the output signal from inverter circuit 407 is cancelled. Thus, deat-time distortion would be compensated thereby.

Figure 12:
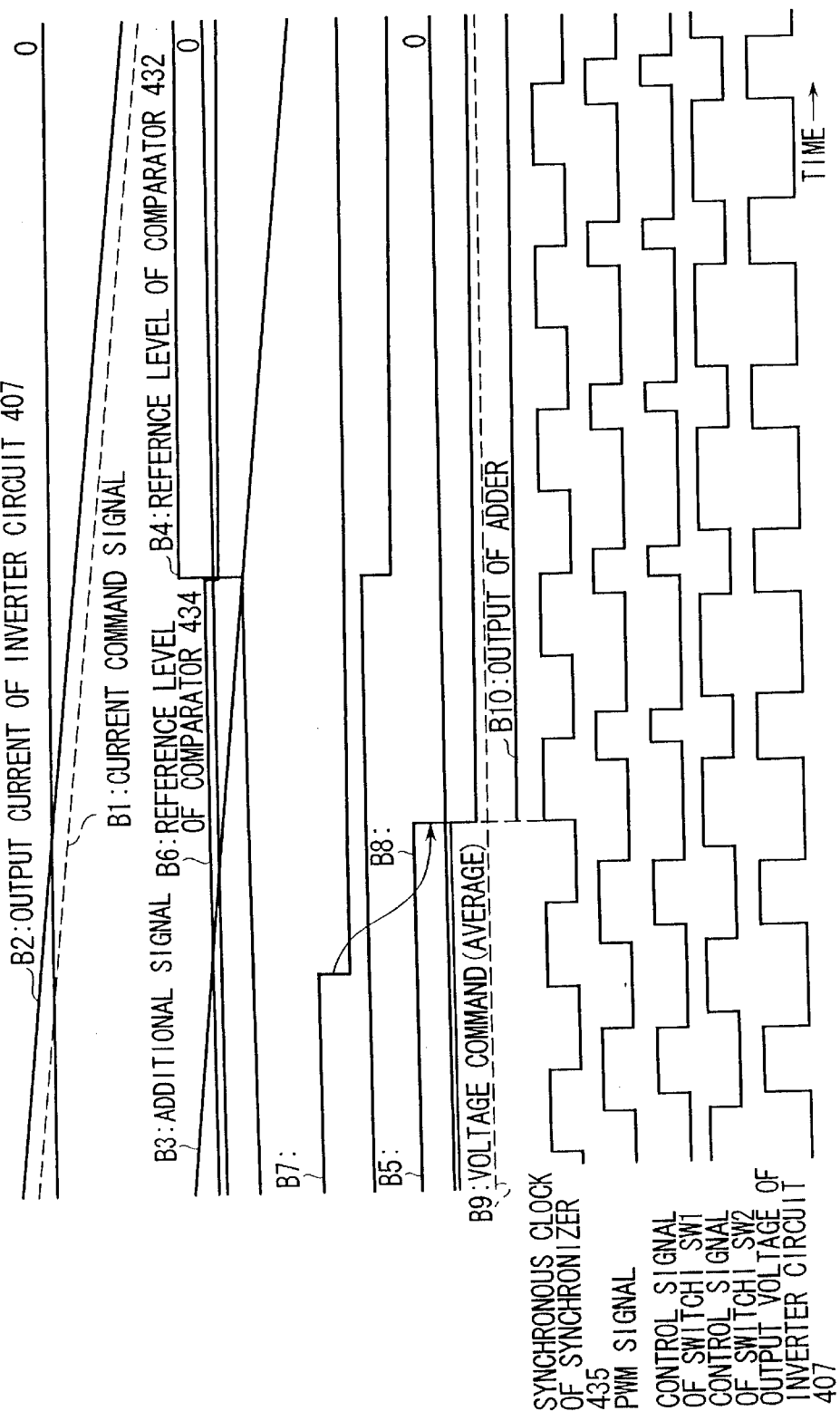
FIG. 12 is a timing chart depicting the relationship between signals appearing at different parts of the circuit diagram of FIG. 11.

FIG. 12 is a timing chart showing the relationship between signals produced in the embodiment of FIG. 11, wherein a current command signal B1 and output current B2 of inverter circuit 407 are added together to produce an addition signal B3. The addition signal B3 is inputted into comparators 432 and 434. Since comparator 432 has a hysteresis characteristic, a reference level B4 is changed when the addition signal B3 is lowered to a point below the reference level B4. At this point the output signal B5 from comparator 432 is changed. The output signal B5 from comparator 432 is changed to a different level by level converter 433 to be supplied as a reference level B6 to comparator 434.

When addition signal B3 is lower than the reference level B6, the output signal B7 from comparator 434 is changed. The output signal B7 from comparator 434 is synchronized with the synchronization clock of synchronizer 435. Then, the level of output signal B7 is changed by level converter 435 to become an output signal B8. The average of the voltage command is negative, as indicated by a symbol B9. The output signal B8 and voltage command signal B9 are added together by adder 437, and the output signal B10 produced thereby is supplied to comparator 406 after correction. The pulse width of PWM signal is shortened after the post correction output signal B10 increases. Hence, a deadband near the zero crossing point in the output current of inverter circuit 407 is cancelled.

Motor 401 may be a direct drive type motor or a linear type motor. Motor 401 may also be a motor for moving slider 11 of the two-dimensional positioning apparatus, wherein slider 11 is levitated such as by means of air bearings.

According to the embodiment of FIGS. 10,11, a voltage command is compensated near the zero crossing point of the output current of inverter circuit 407. Hence, any deadband near the zero crossing point of the output current from inverter circuit 407 is eliminated. Thus, the controllability of the electric current flowing through the motor coils is improved by the invention.

Configuration of the Apparatus For Measuring Laser Light Wavelengths

Figure 13:
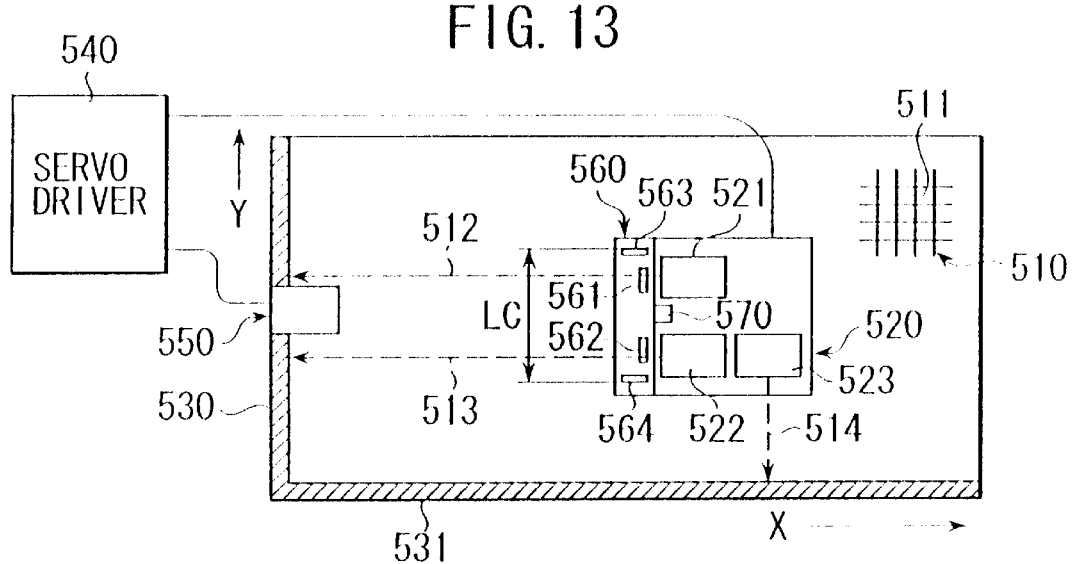
FIG. 13 is a view depicting an example of a two-dimensional positioning apparatus provided with means for detecting laser light wavelengths.

In the position sensor of FIG. 2, position measurement is performed by use of laser light interference. The wavelength of the laser light can be changed due to, for example, aging. Such change would result in inaccuracies of measurement, for example. To detect such a change, means are provided by the invention for measuring the laser light wavelengths. FIG. 13 shows a two-dimensional positioning apparatus provided with an apparatus for measuring the laser light wavelengths, wherein the apparatus comprises a platen 510 which is made of magnetic plates, and on which teeth 511 are formed at fixed pitches in a lattice pattern; a slider 520 which can be moved above the platen 510 in the X-axis direction and the Y-axis direction; an X-axis mirror 530 comprising mirrors located at the end of the X-axis to reflect laser light beams 512 and 513; a Y-axis mirror 531 comprising a mirror located at the end of the Y-axis to reflect a laser light beam 514; an origin sensor 550 located in a suitable position at the end of the X-axis; and a servo driver, i.e. a motor drive unit, 540 for driving and controlling slider 520 in the X-axis direction and the Y-axis direction.

Slider 520 comprises means for levitating slider 520 by means of air bearing mechanism (not shown), rotors comprising cores and coils for moving slider 520 in the X-axis and Y-axis directions by means of magnetic attraction (not shown), and a slit temperature sensor 520 for detecting the temperature of a return-to-origin slit plate 560. The upper section of slider 520 comprises X1-axis and X2-axis laser interferometers 521 and 522 for emitting laser light beams 512 and 513 onto X-axis mirror 530 to detect the X-axis position by means of interference between catoptric light beams from X-axis mirror 530; a Y-axis laser interferometer 523 for emitting laser light beam 514 onto Y-axis mirror 531 to detect the Y-axis position by means of interference between catoptric light beams from Y-axis mirror 531; and a return-to-origin slit plate 560 located on the X-axis of slider 520. The X1-axis and X2-axis laser interferometers 521 and 522 are arranged at a suitable spacing to detect the yaw angle (i.e. rotational angle θ around the Z-axis) of slider 520.

The return-to-origin slit plate 560 is formed using glass slits and comprises two X1 and X2 slits 561 and 562 separately aligned in series in the Y-axis direction; a Y slit 563 positioned to be external and perpendicular to X1 slit 561; and a wave length calibrating C slit 564 positioned to be external and perpendicular to X2 slit 562. The wavelength calibrating C slit 564 is formed so as to be parallel and to share the same width with Y slit 563. Y slit 563 and wavelength calibrating C slit 564 comprise means for detecting laser wavelengths.

Figure 14:
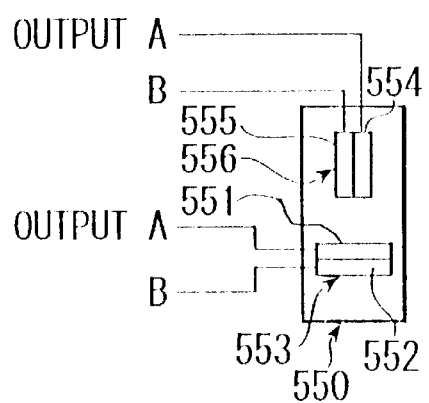
FIG. 14 is a view depicting an example of an origin sensor.

As shown in FIG. 14, origin sensor 550 comprises a light emitter for emitting a light such as laser light; a Y-axis photo detector 553 comprising two photo detectors 551 and 552 arranged at a suitable spacing; and an X-axis photo detector 556 comprising two photo detectors 554 and 555 arranged in a direction perpendicular to Y-axis photo detector 553.

In the embodiment of FIG. 13, slider 520 can be made to move above plate 510 by means of a magnetic force. Additionally, servo driver 540, connected to slider 520, provides positioning control of slider 520 using position signals provided by X1-axis and X2-axis laser interferometers 521 and 522 and Y-axis laser interferometer 523. More specifically, servo driver 540 controls the X-axis position and the rotational angle θ of slider 520 using signals provided by the interference between the catoptric light beams 512 and 513 from the X1-axis and X2-axis laser interferometers 521 and 522 fixed onto slider 520, and detects the Y-axis position provided by the interference between the catoptric beams of the laser light 514 emitted by the Y-axis laser interferometer 523. Also, return-to-origin slit plate 560 located on the X-axis of slider 520 is aligned with the origin sensor 550 located at the X-axis end of platen 510 to cause return to origin action in the X-axis, Y-axis and θ-axis directions.

Figure 15:
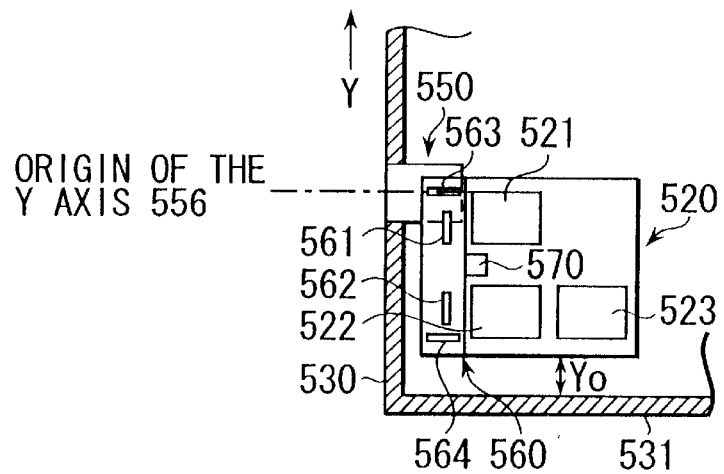
FIG. 15 is a view helpful in explaining behavior of the apparatus of FIG. 13.
Figure 16:
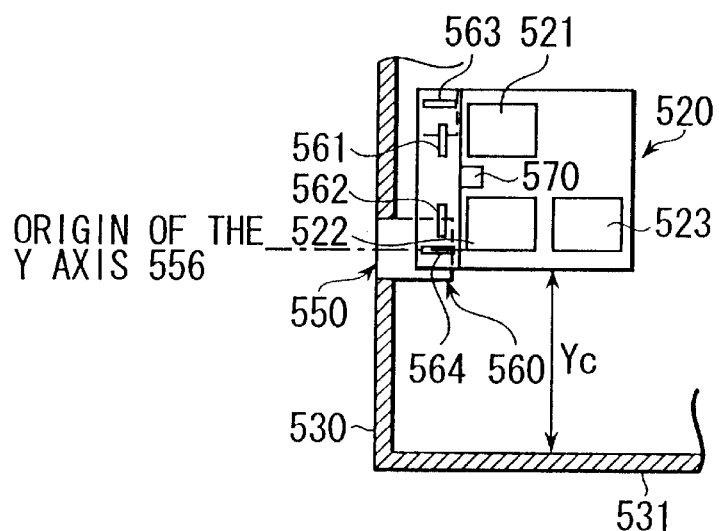
FIG. 16 is a view helpful in explaining behavior of the apparatus of FIG. 13.
Figure 17:
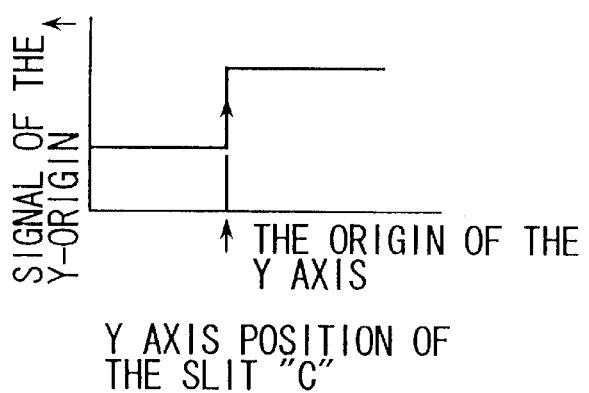
FIG. 17 is a graph helpful in explaining behavior of the apparatus of claim 13.

In the first step of the return to origin action, the ON-OFF state of a Y-axis origin signal is changed, as shown in FIG. 17, when as shown in FIG. 15, the Y slit 563 reaches the Y-axis origin position where the Y-axis photo detector 553 of the origin sensor 550 is located. This enables servo driver 540 to place slider 520 in a Y-axis position where Y slit 563 agrees with the Y-axis origin position. The coefficient (which is the number of detected interference fringes) which is provided at this point by the interference between the catoptric beams of laser light 514 emitted by Y-axis laser interferometer 523 and indicates the detected Y-axis position, is assumed to be Yo.

In the second step of the return to origin action, slider 520 is moved in parallel with X-axis mirror 530 to position slider 520 so that C slit 564 agrees with the Y-axis origin position. The coefficient which is the number of detected interference fringes and is provided at this point by interference between the catoptric beams of laser light 514 emitted by Y-axis interferometer 523 and indicates the detected Y-axis position, is assumed to be Yc. The wavelength λn of a laser light at this point is determined by the following:

$$\lambda n = K \cdot Lc / (Yc - Yo) \quad (4)$$

wherein, K is a design dependent constant, and Yc is the distance between the Y and C slits which is measured during production and set priorly in the servo driver 540. Equation (4) is the equation used for measuring the wavelength of laser light 514 from the interference between the catoptric beams of laser light 514, where the interference occurs at the origin position and is detected by each of the two slits, Y slit 563, and C slit 564, using the same photo detector, that is the Y origin position 556 of the origin sensor 550.

As discussed above, position detection based on the use of the Y slit 563 and C slit 564, and the use of the same origin sensor 550, is performed by moving slider 520 in the Y-axis direction, and thus calculating the distance related coefficients Yo and Yc. Then, laser light wavelength λn is calculated with equation (4) so that deterioration in laser light can be measured each time the return to origin action takes place. By measuring the laser light wavelength in the embodiment, it is possible to achieve laser light detection at lower cost and to maintain high position accuracy even when change occurs due to aging. Additionaly, with the embodiment the operator can receive early warning when an interferometer becomes defective due to change of light wavelength. Also, where temperature and atmospheric pressure changes are moderate, correction of the refractive index may be eliminated by periodic correction of the wavelengths. In other words, with the invention, there is no necessity to have extra temperature and pressure sensors; hence cost reduction is achieved.

The return to origin slit plate 560 expands or contracts slightly depending on the temperature. The expansion or contraction can be readily corrected in the invention, however, by using the temperature detected by the slit temperature sensor. For example, assuming the the temperature error $\Delta T = \pm 1°$ C., Lc=150 mm, the linear expansion factor of the return to origin slip plate 560 is $0.5 \times 10^{-6}$, the error included in Lc is $$0.15(m) \times 0.5 \times 10^{-6} \times 1 = 0.075 \times 10^{-6}.$$

Assuming the reproduction accuracy of the origin signal of origin sensor 550 is $\pm 0.1$ μm, the temperature error occurring in (Yc−Yo) is $\pm 0.2$ μm. Hence, the accuracy with which the laser light wavelength λn is detected is approximately $$(0.075 \times 10^{-6} + 0.2 \times 10^{-6})/0.15$$

$$= 1.8 \times 10^{-6}$$

$$= 1.8 \text{ ppm}$$

This means that the position detection error occurring when the distance of the X1-axis and X2-axis laser interferometer 521 and 522 from the X-axis mirror 530 is 1 μm, is maintained at approximately 2 μm.

The distance of C slit 564 from Y slit 563 can be as great as possible in the embodiment, while maintaining the positional relationship between the Y and C slits 563 and 564 to be the same. Hence, with the invention, deterioration in the laser light of the laser interferometer can be detected at an early stage by simply measuring the error occuring between the detection accuracies of the Y slit 563 and C slit 564.

Moreover, in the FIG. 13 embodiment, the two slits at the moment of returning to origin are used to measure the wavelength of the laser light using the difference in the interference between the catoptric beams of laser light emitted from the different positions of the slider 520. Hence, the invention is advantageous in that early stage detection of laser light deterioration due to aging is possible and hence high accuracy of slider positioning is maintained.

The foregoing description is illustrative of the principles of the invention. Numerous extensions and modifications thereof would be apparent to the worker skilled in the art. All such extensions and modifications are to be considered to be within the spirit and scope of the invention.

What is claimed is:

1. A two-dimensional positioning apparatus for positioning an object in a two dimensional direction, said apparatus comprising:

a platen comprising teeth formed at fixed spacings along X and Y axes;

a slider comprising two X-axis motors, two X-axis position sensors, a Y-axis motor, and a Y-axis position sensor, said slider being loaded with said object and disposed above said platen;

a converter for producing signals for detecting X-axis position of a center point of said slider and a yaw angle θ of said slider according to position detector signals from said two X-axis position sensors;

an Xθ controller for feedback controlling movement of said slider in X-axis and θ-axis directions separately according to signals converted by said converter;

a command converter circuit for converting control output of said controller to propulsion commands to be supplied to said two X-axis motors, said command converter circuit comprising:

means for receiving X-axis and θ-axis propulsion commands outputted by said controller and for producing propulsion commands to be supplied to said two X-axis motors according to a sum of and a difference between said X-axis and θ-axis propulsion commands, and means for restricting X-axis limits of said propulsion commands Ir0 to Imax−|Irθ|, wherein Imax is the maximum value of the propulsion commands and Irθ is a θ-axis propulsion command; and a Y-axis controller for receiving a position detection signal from said Y-axis position sensor, and for feedback controlling Y-axis direction according to said position detection signal.

2. The apparatus of claim 1, further comprising:

levitating means for levitating said slider so that said slider is disposed above said platen; and wherein said Y-axis motor is mounted on said slider to move said slider in a Y-axis direction; wherein said two X-axis motors are mounted symmetrically around said center point of said slider to move said slider in an X-axis direction; wherein said Y-axis position sensor detects a Y-axis position of said slider; wherein said two X-axis position sensors are mounted on said two X-axis motors, respectively, to detect respective X-axis positions of said slider; wherein said command converting circuit receives position detection signals from said two X-axis position sensors and produces a signal for detecting an X-axis position of said center point of said slider according to a sum of said position detection signals, and produces a signal for detecting yaw angle θ of said slider according to a difference between said position detection signals; and wherein said control outputs converted by said command converting circuit are X-axis-and θ-axis propulsion commands.

3. The apparatus of claim 1, wherein said two X-axis motors comprise cores having teeth formed thereon opposite teeth of said platen at fixed spacings along X-axis, said cores of said two X-axis motors being arranged symmetrically around said center point of said slider.

4. The apparatus of claim 1, wherein said Y-axis position sensor and said two X-axis position sensors optically detect position using laser interferometers and are provided with corner cubes, said corner cube of said Y-axis position sensor being arranged at a center point of Y-axis and said corner cubes of said two X-axis position sensors being arranged symmetrically around X-axis center line of said slider.

5. A two-dimensional positioning apparatus for positioning an object in a two dimensional direction, said apparatus comprising:

a platen comprising teeth formed at fixed spacings along X and Y axes;

a slider comprising two X-axis motors, two X-axis positioning sensors, a Y-axis motor, and a Y-axis position sensor, said slider being loaded with said object and disposed above said platen;

a converter for producing signals for detecting X-axis position of a center point of said slider and a yaw angle θ of said slider according to position detector signals from said two X-axis position sensors;

an Xθ controller for feedback controlling movement of said slider in X-axis and θ-axis directions separately according to signals converted by said converter;

a command converting circuit for converting control output of said controller to propulsion commands to be supplied to said two X-axis motors;

a Y-axis controller for receiving a position detection signal from said Y-axis position sensor, and for feedback controlling Y-axis direction according to said position detection signal;

levitating means for levitating said slider so that said slider is disposed above said platen; wherein said Y-axis motor is mounted on said slider to move said slider in a Y-axis direction; wherein said two X-axis motors are mounted symmetrically around said center point of said slider to move said slider in an X-axis direction; wherein said Y-axis position sensor detects a Y-axis position of said slider; wherein said two X-axis position sensors are mounted on said two X-axis motors, respectively, to detect respective X-axis positions of said slider; wherein said command converting circuit receives position detection signals from said two X-axis position sensors and produces a signal for detecting an X-axis position of said center point of said slider according to a sum of said position detection signals, and produces a signal for detecting yaw angle θ of said slider according to a difference between said position detection signals; and wherein said control outputs converted by said command converting circuit are x-axis and θ-axis propulsion commands; and further comprising:

a limiter for restricting X-axis limits of a propulsion command Ir0 to Imax−|Irθ|, wherein Imax is the maximum value of the propulsion command and Irθ is θ-axis propulsion command, and thereby restricting limits of propulsion command Ir0 according to magnitude of θ-axis propulsion command Irθ.

6. The apparatus of claim 5, wherein said command converting circuit receives X-axis and θ-axis propulsion commands outputted by said Xθ controller to produce propulsion commands to be supplied to said two X-axis motors according to a sum of and a difference between said X-axis and θ-axis propulsion commands.

7. The apparatus of claim 5, wherein said X-axis motors comprise cores having teeth formed thereon opposite said teeth of said platen at fixed spacings along X-axis, said cores of said two x-axis motors being arranged symmetrically around said center point of said slider.

8. The apparatus of claim 5, wherein said Y-axis position sensor and said two X-axis position sensors optically detect position using laser interferometers and are provided with corner cubes, said corner cube of said Y-axis position sensor being arranged at a center point of Y-axis and said corner cubes of said two X-axis position sensors being arranged symmetrically around X-axis center line of said slider.

* * * * *